(12) United States Patent
Liu

(10) Patent No.: US 10,937,692 B2
(45) Date of Patent: Mar. 2, 2021

(54) METHOD FOR REDUCING VIA RC DELAY

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Jiquan Liu, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 20 days.

(21) Appl. No.: 15/624,879

(22) Filed: Jun. 16, 2017

(65) Prior Publication Data

US 2018/0012797 A1    Jan. 11, 2018

(30) Foreign Application Priority Data

Jul. 7, 2016    (CN) .......................... 201610532198.7

(51) Int. Cl.
*H01L 21/768*    (2006.01)
*H01L 21/285*    (2006.01)
(Continued)

(52) U.S. Cl.
CPC .... *H01L 21/76883* (2013.01); *H01L 21/2855* (2013.01); *H01L 21/76843* (2013.01);
(Continued)

(58) Field of Classification Search
CPC ......... H01L 21/76883; H01L 21/76846; H01L 21/76873; H01L 21/2885; H01L 23/5226
See application file for complete search history.

(56) References Cited

U.S. PATENT DOCUMENTS 6,342,448 B1    1/2002    Lin et al.
6,346,745 B1 *  2/2002    Nogami ............ H01L 23/53233
                                                     257/751
(Continued)

FOREIGN PATENT DOCUMENTS

CN    101903990    12/2010
CN    102005411    4/2011
(Continued)

OTHER PUBLICATIONS

CN 102005411 (Year: 2011).*
(Continued)

*Primary Examiner* — Ahmed N Sefer
(74) *Attorney, Agent, or Firm* — Anova Law Group, PLLC

(57) ABSTRACT

A method for manufacturing an interconnect structure includes providing a substrate structure including a substrate, a first metal layer on the substrate, a dielectric layer on the substrate and covering the first metal layer, and an opening extending to the first metal layer; forming a first barrier layer on a bottom and sidewalls of the opening with a first substrate bias; forming a second barrier layer on the first barrier layer with a second substrate bias, the second substrate bias being greater than the first substrate bias, the first and second barrier layers forming collectively a barrier layer; removing a portion of the barrier layer on the bottom and on the sidewalls of the opening by bombarding the barrier layer with a plasma with a vertical substrate bias; and forming a second metal layer filling the opening.

16 Claims, 5 Drawing Sheets

(51) Int. Cl.
    *H01L 23/522*    (2006.01)
    *H01L 23/532*    (2006.01)
(52) U.S. Cl.
    CPC .. *H01L 21/76844* (2013.01); *H01L 21/76846* (2013.01); *H01L 21/76865* (2013.01); *H01L 21/76873* (2013.01); *H01L 23/5226* (2013.01); *H01L 23/53238* (2013.01)

(56) References Cited

U.S. PATENT DOCUMENTS

| | | | | |
|---|---|---|---|---|
| 6,433,429 | B1* | 8/2002 | Stamper | H01L 21/76846 257/654 |
| 6,642,146 | B1 | 11/2003 | Rozbicki et al. | |
| 6,825,566 | B1* | 11/2004 | Sakata | H01L 21/76801 257/741 |
| 6,952,052 | B1* | 10/2005 | Marathe | H01L 21/76846 257/750 |
| 2004/0127014 | A1* | 7/2004 | Huang | H01L 21/76843 438/627 |
| 2004/0129670 | A1* | 7/2004 | Kweon | H01L 21/76828 216/22 |
| 2004/0140196 | A1 | 7/2004 | Gopalraja et al. | |
| 2005/0098897 | A1* | 5/2005 | Edelstein | H01L 21/76846 257/762 |
| 2005/0153546 | A1* | 7/2005 | Ahrens | H01L 21/76843 438/677 |
| 2005/0263390 | A1 | 12/2005 | Gung et al. | |
| 2006/0183327 | A1* | 8/2006 | Moon | H01L 21/76843 438/687 |
| 2007/0032062 | A1* | 2/2007 | Lee | H01L 21/76832 438/597 |
| 2007/0085211 | A1* | 4/2007 | Hamada | H01L 21/2855 257/758 |
| 2008/0038919 | A1 | 2/2008 | Ikeda | |
| 2009/0197404 | A1* | 8/2009 | Yang | H01L 21/02063 438/652 |
| 2009/0273085 | A1* | 11/2009 | Jourdan | H01L 21/76831 257/751 |
| 2010/0044864 | A1* | 2/2010 | Maekawa | H01L 21/2855 257/751 |
| 2014/0021615 | A1* | 1/2014 | Ryan | H01L 23/53209 257/751 |
| 2016/0141250 | A1* | 5/2016 | Bao | H01L 23/53238 257/751 |
| 2017/0092589 | A1* | 3/2017 | Chen | H01L 23/53238 |
| 2017/0117179 | A1* | 4/2017 | Koschinsky | H01L 21/76862 |
| 2017/0117218 | A1* | 4/2017 | Liu | H01L 21/76804 |
| 2017/0207175 | A1* | 7/2017 | Kang | H01L 23/53266 |
| 2018/0151426 | A1* | 5/2018 | Zhu | H01L 21/2885 |

FOREIGN PATENT DOCUMENTS

| | | | |
|---|---|---|---|
| KR | 2001-0092704 | * | 10/2001 |
| KR | 2009-1198 | * | 1/2010 |

OTHER PUBLICATIONS

Machine translated document (Year: 2011).*
European Application No. 17179996.8, Extended European Search Report dated Dec. 6, 2017, 11 pages.
Chinese Application No. 201610532198.7, Office Action dated Jul. 2, 2019, 8 pages.
Chinese Application No. 201610532198.7, Office Action dated May 9, 2020, 6 pages.

* cited by examiner

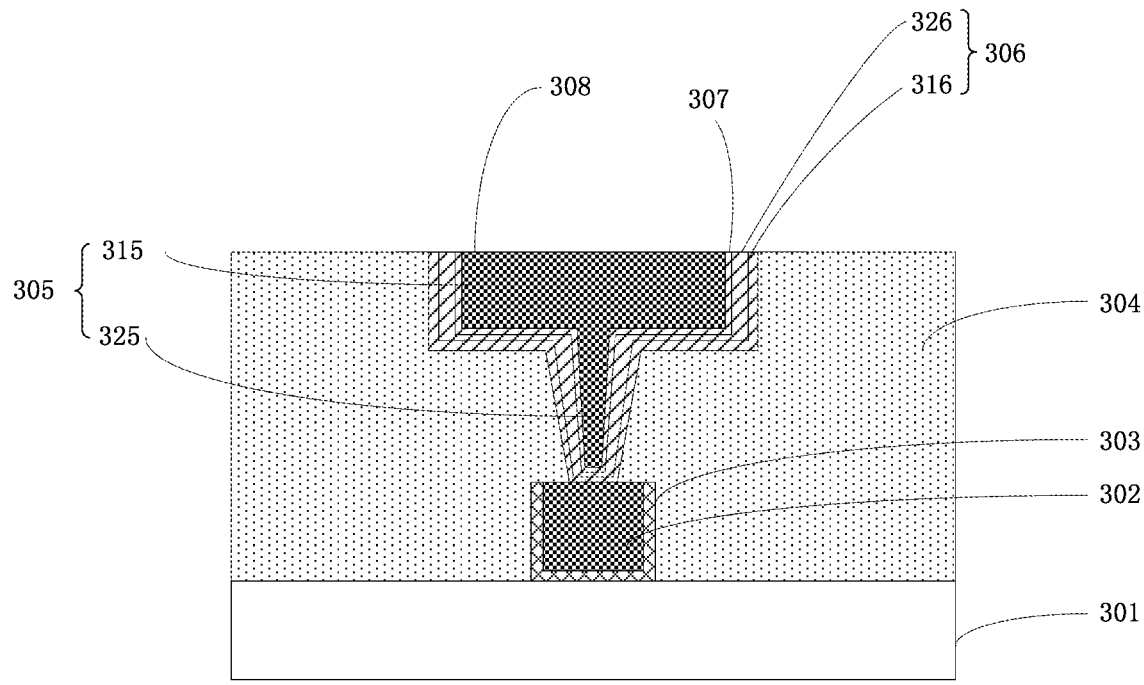

FIG. 3G

| Provide a substrate structure including a substrate, a first metal on the substrate, a dielectric layer on the substrate, an opening extending through the dielectric layer to the first metal and including a trench in the upper portion and a through-hole in the lower portion | 402 |

| Form a barrier layer on the bottom and sidewalls of the trench and through-hole with no bias applied to the substrate | 404 |

| Remove a portion of the barrier layer on the bottom of the trench and through-hole by bombarding the barrier layer with a plasma and a vertical bias applied to the substrate | 406 |

| Form a second metal layer filling the opening | 408 |

FIG. 4

METHOD FOR REDUCING VIA RC DELAY

CROSS-REFERENCES TO RELATED APPLICATIONS

The present application claims priority to Chinese patent application No. 201610532198.7, filed with the State Intellectual Property Office of People's Republic of China on Jul. 7, 2016, the content of which is incorporated herein by reference in its entirety.

FIELD OF THE INVENTION

The present invention relates to semiconductor technology, and more particularly to an interconnect structure and manufacturing method thereof.

BACKGROUND OF THE INVENTION

Devices in the semiconductor industry continue to advance toward higher performance through increases in transistor speed. As contact or through-hole openings decrease in size, the aspect ratio (ratio of the depth of the through-hole to the diameter of the through-hole) increases. FIG. 1 is a cross-sectional view of a prior art interconnect structure at an intermediate stage of manufacture. In the prior art interconnect structure, a dielectric layer 102 is formed on a metal layer 101. After a trench 103 and a via 104 are formed by etching a dielectric layer 102, a barrier layer 105 is generally required to be formed on the bottom and sidewalls of trench 103 and via 104 to block a subsequent formed metal from diffusing into dielectric layer 102. However, since the resistivity of barrier layer 105 is relatively high, the resistance of via 104 is relatively large.

In the prior art, in order to reduce the resistance of via 104, it is common practice to use plasma to bombard barrier layer 105 on the bottom of trench 103 and barrier layer 104 to reduce the thickness of the barrier layer. However, the inventor discovered that plasma may etch through barrier layer 105 at the bottom of trench 103, thereby forming spike-like voids 106 in the portion of dielectric layer 102 below the bottom of trench 103. The spike-like voids 106 may cause leakage in the interconnect structure and parasitic capacitance, thereby affecting the performance and reliability of the interconnect structure.

Therefore, a novel method of manufacturing an interconnect structure is needed to increase the reliability and performance of the interconnect structure.

BRIEF SUMMARY OF THE INVENTION

The present invention provide a novel method of manufacturing an interconnect structure and an interconnect structure manufactured by the novel method.

In accordance with the present disclosure, a method for manufacturing an interconnect structure may include providing a substrate structure including a substrate, a first metal layer on the substrate, a dielectric layer on the substrate and covering the first metal layer, and an opening extending through the dielectric layer to a surface of the first metal layer, the opening having a trench in the upper portion and a through-hole in a lower portion; forming a first barrier layer on a bottom and sidewalls of the trench and on a bottom and sidewalls of the through-hole with a first bias applied to the substrate; forming a second barrier layer on the first barrier layer with a second bias applied to the substrate, the second bias being greater than the first bias, the first and second barrier layers forming collectively a barrier layer; removing a portion of the barrier layer on the bottom and on the sidewalls of the trench and a portion of the barrier layer on the bottom and on the sidewalls of the through-hole by bombarding the barrier layer with a plasma with a vertical bias applied to the substrate to form a remaining barrier layer; and forming a second metal layer filling the opening.

In one embodiment, the first bias has a bias power of 0 (zero) W. In one embodiment, the second bias has a bias power in a range between 200 W and 800 W.

In one embodiment, the vertical bias includes a bias power in a range between 500 W and 100 W, a plasma flow rate of 10 to 50 sccm, and a bombardment time in a range between 3 seconds and 5 seconds.

In one embodiment, a source gas for the plasma includes an inert gas.

In one embodiment, at least 50% of the portion of the barrier layer on the bottom and on the sidewalls of the trench and at least 50% of the portion of the barrier layer on the bottom and on the sidewalls of the through-hole are removed.

In one embodiment, forming the first barrier layer comprises a sputtering process with a sputtering power in a range between 5 kW and 25 kW. In one embodiment, forming the second barrier layer comprises a sputtering process with a sputtering power in a range between 10 kW and 25 kW.

In one embodiment, the method may further include, after removing the portion of the barrier layer on the bottom and on the sidewalls of the trench and the portion of the barrier layer on the bottom and on the sidewalls of the through-hole, and prior to forming the second metal layer, forming a third barrier layer on the remaining barrier layer.

In one embodiment, the first barrier layer, the second barrier layer, and the third barrier layer each include TaN, Ta, or a stack of at least one TaN layer and at least one Ta layer.

In one embodiment, the method may further include, prior to forming the second meal layer filling the opening, forming a seed layer on the third barrier layer.

In one embodiment, the seed layer includes a Cu material, a CuAl alloy film, or a CuMn alloy film. In one embodiment, the CuMn (copper-manganese) alloy film includes an Mn atomic percent in a range between 0.05% and 10%.

In one embodiment, removing the portion of the barrier layer on the bottom and on the sidewalls of the trench and the portion of the barrier layer on the bottom and on the sidewalls of the through-hole comprises completely removing the portion of the barrier layer on the bottom and on the sidewalls of the trench to expose the bottom of the trench and completely removing the portion of the barrier layer on the bottom and on the sidewalls of the through-hole to expose the bottom of the through-hole; and prior to forming the second metal layer, the method further includes forming a third barrier layer on the exposed bottom of the trench, the exposed bottom of the through-hole, and on the remaining barrier layer.

In one embodiment, the method may further include planarizing the second metal layer such that an upper surface of the second metal layer is substantially flush with an upper surface of the dielectric layer. In one embodiment, the first metal layer and the second metal layer each include copper.

In one embodiment, the opening has a width in a range between 20 nm and 80 nm and a depth in a range between 20 nm and 80 nm. In one embodiment, the opening is a dual damascene opening.

In one embodiment, the first barrier has a thickness in a range between 3 angstroms and 15 angstroms; and the second barrier has a thickness in a range between 10 angstroms and 100 angstroms.

Embodiments of the present disclosure also provide a method for manufacturing an interconnect structure, which may include providing a substrate structure including a substrate, a first metal layer on the substrate, a dielectric layer on the substrate and covering the first metal layer, and an opening extending through the dielectric layer to the first metal layer, the opening having a trench in the upper portion and a through-hole in a lower portion; forming a barrier layer on a bottom and sidewalls of the trench and on a bottom and sidewalls of the through-hole with a first bias applied to the substrate; removing a portion of the barrier layer on the bottom and on the sidewalls of the trench and a portion of the barrier layer on the bottom and on the sidewalls of the through-hole by bombarding the barrier layer with a plasma with a vertical bias applied to the substrate; and forming a second metal layer filling the opening.

Embodiments of the present disclosure also provide an interconnect structure. The interconnect structure include a substrate; a first metal layer on the substrate; a dielectric layer on the substrate covering the first metal layer; an opening extending through the dielectric layer to the first metal layer, the opening including a trench in an upper portion and a through-hole in a lower portion; a first barrier layer on a bottom and sidewalls of the trench and on a bottom and sidewalls of the through-hole; a second barrier layer on the first barrier layer; and a second metal layer on the second barrier layer filling the opening. The sum of thicknesses of a portion of the first barrier layer and a portion of the second barrier layer on the bottom of the through-hole is less than the sum of thicknesses of a portion of the first barrier layer and a portion of the second barrier on a sidewall of the through-hole.

In one embodiment, the interconnect structure further includes a third barrier layer disposed between the second barrier layer and the second metal layer.

In one embodiment, the interconnect structure further includes a seed layer disposed between the third barrier layer and the second metal layer.

The following description, together with the accompanying drawings, will provide a better understanding of the nature and advantages of the claimed invention.

BRIEF DESCRIPTION OF THE DRAWINGS

The accompanying drawings, which are included to provide a further understanding of the invention and are incorporated in and constitute a part of this application, illustrate certain embodiments of the invention. In the drawings:

FIG. 3G is a cross-sectional view illustrating an intermediate stage of a method for manufacturing an interconnect structure according to one embodiment of the present disclosure; and FIG. 4 is a simplified flowchart of a method for manufacturing an interconnect structure according to another embodiment of the present disclosure.

DETAILED DESCRIPTION OF THE INVENTION

Figure 1:
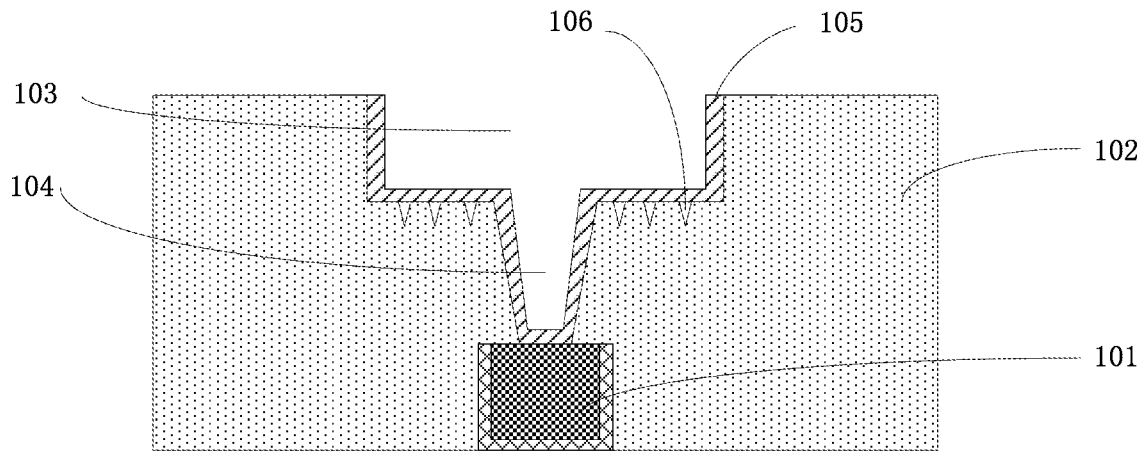
FIG. 1 is a cross-sectional view of an interconnect structure, as known in the prior art.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Techniques, methods and devices known to one of ordinary skill in the relevant art may not be discussed in detail, but in situations in which these techniques, methods and apparatus apply, these techniques, methods and apparatus should be considered as part of this specification. Further, similar reference numerals and letters are used to refer to similar items in the following figures, and once an item is defined in one of the figures, it will not need to be explained further in the subsequent figures.

The present inventor studied the above-described problems and discovered that a bias (electric field) is applied to a substrate in order to obtain a better step coverage in forming a barrier layer in the conventional process. The application of a larger bias to the substrate is also required in the subsequent plasma process to bombard the barrier layer on the bottom of the trench and through-hole to reduce the thickness of the barrier layer, the plasma has a greater energy at a larger substrate bias. The greater energy may cause the plasma to penetrate the barrier layer, thereby forming spike-like voids (spikes) in the dielectric layer. The present inventor thus proposes the following solutions.

Figure 2:
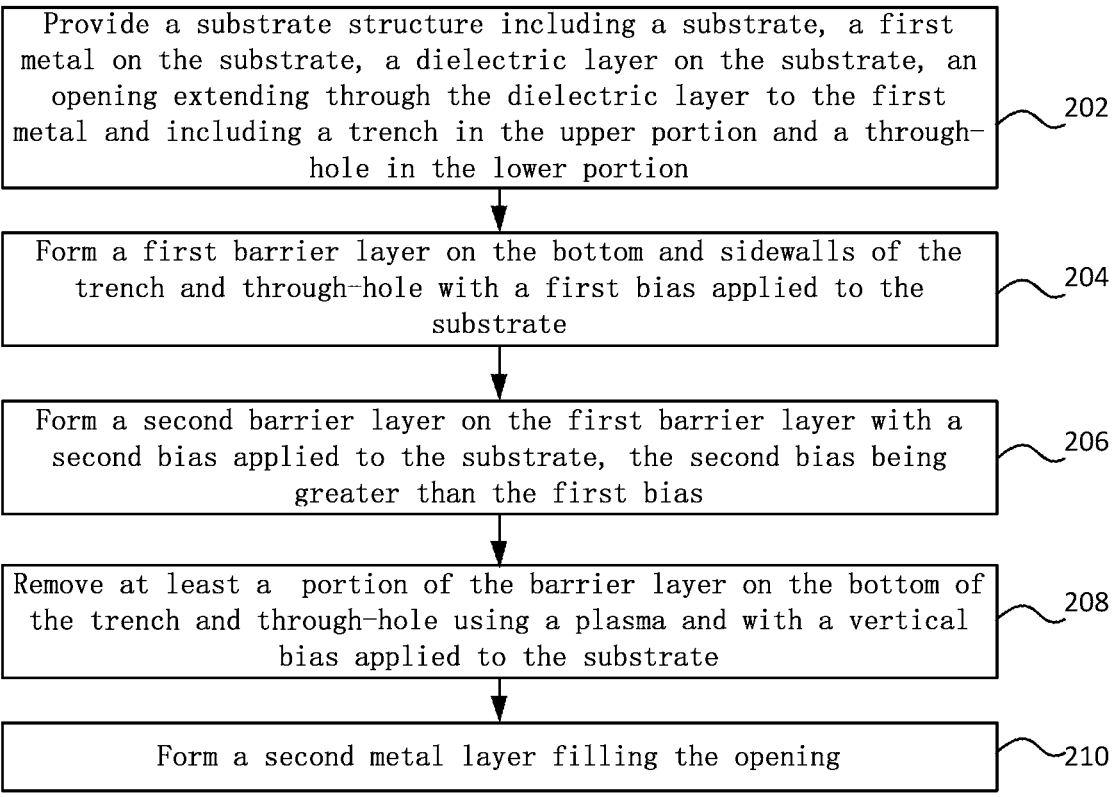
FIG. 2 is a simplified flowchart of a method for manufacturing an interconnect structure according to one embodiment of the present disclosure.

FIG. 2 is a simplified flowchart of a method for manufacturing an interconnect structure according to one embodiment of the present disclosure. Referring to FIG. 2, the method may include the following steps:

Step 202: providing a substrate structure including a substrate, a first metal layer on the substrate, and a dielectric layer on the substrate and overlying the first metal layer. The dielectric layer includes an opening extending to the first metal layer. The opening includes a trench in the upper portion and a through-hole in a lower portion.

Step 204: forming a first barrier layer on the bottom and sidewalls of the trench and on the bottom and sidewalls of the through-hole with a first bias applied to the substrate.

Step 206: forming a second barrier layer on the first barrier layer with a second bias applied to the substrate, the second bias is greater than the first bias. The first and second barrier layers are collectively referred to as the barrier layer.

Step 208: removing at least a portion of the barrier layer on the bottom of the trench and on the bottom of the through-hole by bombarding the barrier layer on the bottom and sidewalls of the trench and through-hole using a plasma and with a vertical bias applied to the substrate.

Step 210: forming a second metal layer filling the opening.

In the embodiment, forming the barrier layer includes two steps: a first barrier layer is first formed by applying a low bias to the substrate, and a second barrier layer is then formed on the first barrier layer by applying a high bias voltage to the substrate. Comparing with forming directly a barrier layer with a relatively high bias applied to the substrate in the prior art, due to the relatively low adhesion between the first barrier layer and the second barrier layer, the first and second barrier layers can be easily removed, so that the barrier layer can be removed with a smaller bias when bombarding the barrier layer on the bottom of the trench and the bottom of the through-hole, thereby reducing the likelihood of spike formation in the dielectric layer and increasing the reliability of the interconnect structure.

FIGS. 3A through 3G are cross-sectional views of intermediate stages of a method for manufacturing an interconnect structure according to some embodiments of the present disclosure.

Figure 3A:
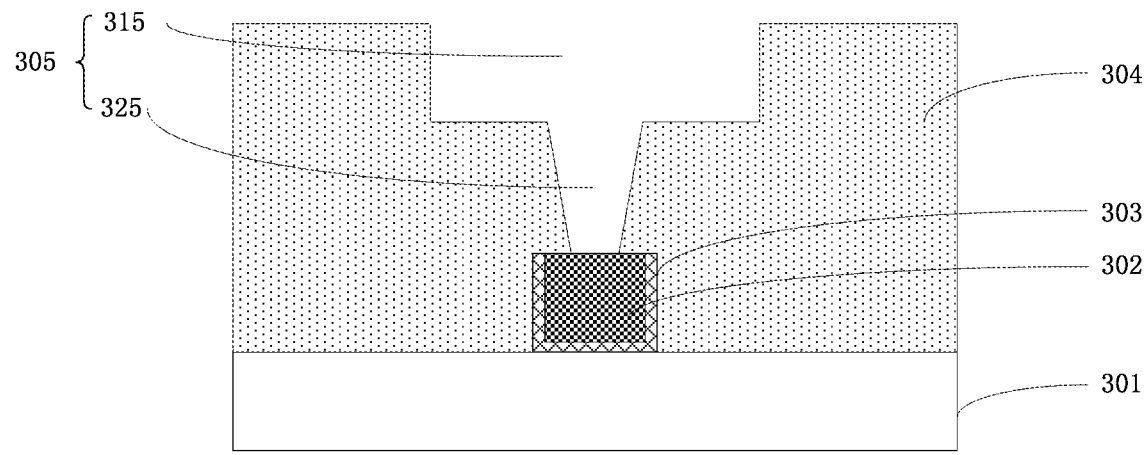
FIG. 3A is a cross-sectional view illustrating an intermediate stage of a method for manufacturing an interconnect structure according to one embodiment of the present disclosure.

Referring to FIG. 3A, a substrate structure is provided. The substrate structure includes a substrate 301 having a semiconductor substrate, a semiconductor device on the semiconductor substrate, and a shallow trench isolation, and the like. Herein, a specific structure of substrate 301 is not shown for the sake of clarity.

The substrate structure also includes a first metal layer (e.g. copper) 302 on substrate 301. In one embodiment, a barrier layer 303 (e.g., Ta, TaN, or a layer stack of Ta and TaN) is formed on the bottom and sidewalls of first metal layer.

The substrate structure also includes a dielectric layer 304 on substrate 301 covering first metal layer 302. Dielectric layer 304 includes an opening 305 extending to first metal layer 302. In one embodiment, opening 305 is a dual damascene opening having a trench 315 in the upper portion and a through-hole 325 in the lower portion. In one embodiment, opening 305 has a width in the range between 20 nm and 80 nm, e.g., 30 nm, 50 nm, 60 nm, etc., and a depth in the range between 20 nm and 300 nm, e.g., 50 nm, 100 nm, 150 nm, 200 nm, etc. That is, trench 315 and through-hole 325 each may have a width in the range between 20 nm and 80 nm and a depth in the range between 20 nm and 300 nm. It is understood that opening 305 may be formed using a known damascene technique, and the detail of the damascene technique is omitted herein for the sake of brevity.

Figure 3B:
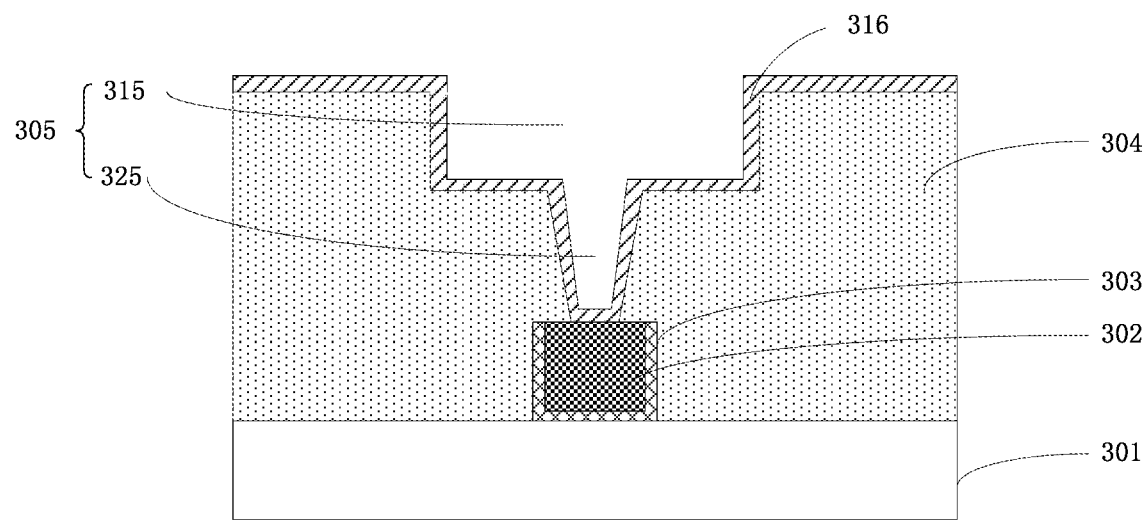
FIG. 3B is a cross-sectional view illustrating an intermediate stage of a method for manufacturing an interconnect structure according to one embodiment of the present disclosure.

Next, referring to FIG. 3B, a first barrier layer 316 is formed on the bottom and sidewalls of trench 315 and on the bottom and sidewalls of through-hole 325 by applying a first bias to the substrate. It will be appreciated that first barrier layer 316 may also be formed on the surface of dielectric layer 304 at the same time. In one embodiment, the first bias electric power is 0 (zero) W. With the bias electric power of the first bias being zero (0 W), the plasma does not significantly impinge (bombard) on first metal layer 302 during the formation of first barrier layer 316, so that the bonding force between first barrier layer 316 and first metal layer 302 is very small.

As used herein, the term "bias electric power" or "bias power" refers to the magnitude of the bias (electric field) applied to the substrate. In one embodiment, first barrier layer 316 includes TaN (tantalum nitride), Ta (tantalum) or a stack of at least one TaN layer and one Ta layer (also referred to as a layer stack of TaN and Ta). First barrier layer 316 may have a thickness in the range between 3 angstroms and 15 angstroms. In one embodiment, first barrier layer 316 may be formed using a sputtering process, and the DC sputtering power applied to the target is in the range between 5 kW and 25 kW.

Figure 3C:
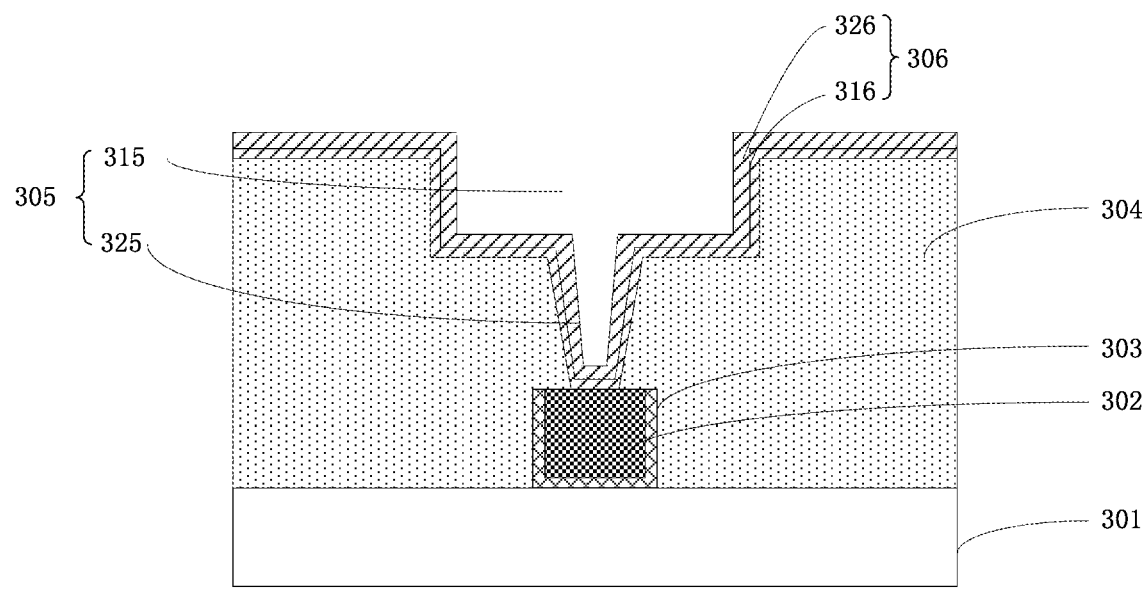
FIG. 3C is a cross-sectional view illustrating an intermediate stage of a method for manufacturing an interconnect structure according to one embodiment of the present disclosure.

Next, referring to FIG. 3C, a second barrier layer 326 is formed on the first barrier layer 316 by applying a second bias to the substrate, the second bias is greater than the first bias. Herein, first barrier layer 316 and second barrier layer 326 are collectively referred to as barrier layer 306. In a preferred embodiment, the AC bias power of the AC second bias is in the range between 200 W and 800 W, e.g., 400 W, 500 W, 700 W, etc. In one embodiment, second barrier layer 326 includes TaN, Ta, or a layer stack of TaN and Ta. It is to be understood that first barrier layer 316 and second barrier layer 326 may have the same material or different materials. In a preferred embodiment, first barrier layer 316 and second barrier layer 326 each include a stack of at least a TaN layer and a Ta layer. Second barrier layer 326 has a thickness in the range between 10 angstroms and 100 angstroms, e.g., 20 angstroms, 50 angstroms, 70 angstroms, etc. In one embodiment, second barrier layer 326 may be formed using a sputtering process with a sputtering power in the range between 10 kW and 25 kW, e.g., 15 kW, 20 kW, etc.

Figure 3D:
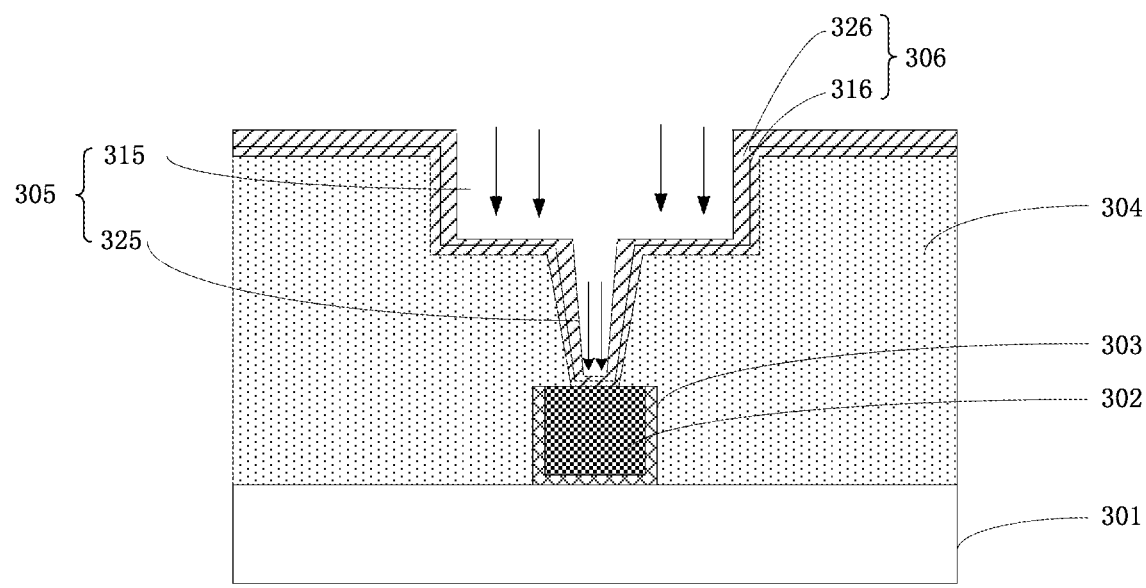
FIG. 3D is a cross-sectional view illustrating an intermediate stage of a method for manufacturing an interconnect structure according to one embodiment of the present disclosure.

Next, referring to FIG. 3D, a plasma process is performed by bombarding barrier layer 306 on the bottom of trench 315 and the bottom of through-hole 325 with ions to remove a portion of barrier layer 306 on the bottom of trench 315 and a portion of barrier layer 306 on the bottom of through-hole 325 by applying a vertical bias to the substrate. As used herein, the term "vertical bias" refers to the bias direction that is substantially perpendicular to the main surface of substrate 301. The plasma is moved by the vertical bias in a direction substantially perpendicular to the bottom of trench 315 and the bottom of through-hole 325 so that only a portion of barrier layer 306 on the bottom of trench 315 and a portion of barrier layer 306 on the bottom of through-hole 325 are removed. In a preferred embodiment, the bias power of the vertical bias may be in the range from about 500 W to about 1000 W, e.g., 600 W, 800 W, etc. The flow rate of the plasma may be in the range from about 10 sccm to about 50 sccm, e.g., 20 sccm, 40 sccm, etc. The bombardment time is in the range between 3 seconds and 5 second seconds, e.g., 3 s, 4 s, 5 s. The source gas of the plasma may include an inert gas, e.g., argon. In one embodiment, a portion of barrier layer 306 on the bottom of trench 315 and a portion of barrier layer 306 on the bottom of through-hole 325 are removed. Further, more than 50% of the thickness of barrier layer 306 on the bottom of trench 315 and on the bottom of through-hole 325 can be removed. In another embodiment, the portion of barrier layer 306 on the bottom of trench 315 and on the bottom of through-hole 325 can be entirely removed. FIG. 3D is a cross-sectional view showing that only a portion of barrier layer 306 on the bottom of trench 315 and a portion of barrier layer 306 on the bottom of through-hole 325 are removed to form a remaining barrier layer.

Figure 3E:
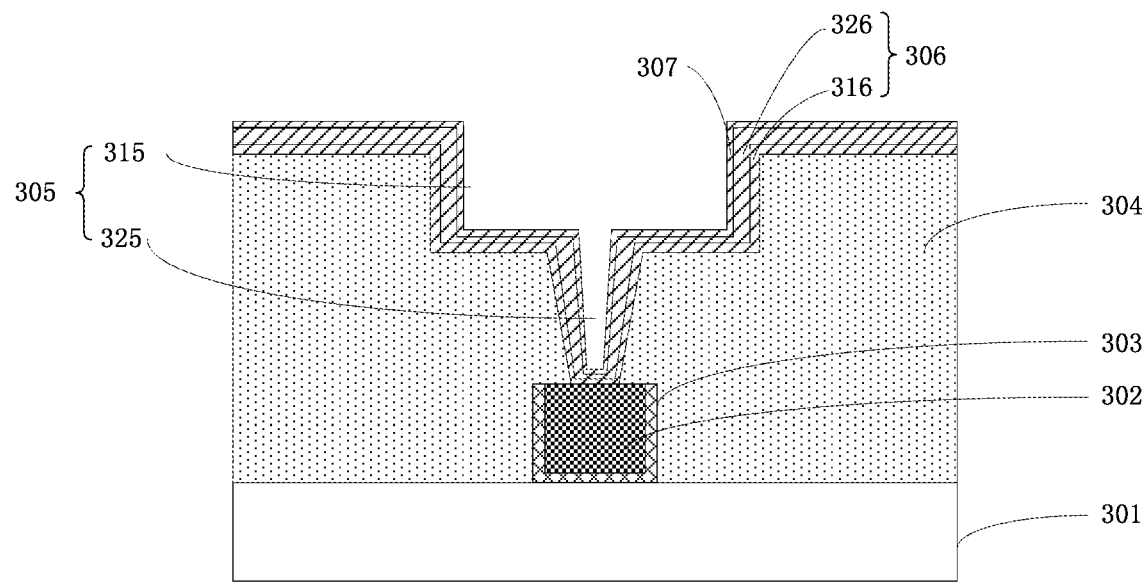
FIG. 3E is a cross-sectional view illustrating an intermediate stage of a method for manufacturing an interconnect structure according to one embodiment of the present disclosure.

Next, referring to FIG. 3E, a third barrier layer 307 is formed on the remaining barrier layer 306. In the case where the portion of barrier layer 306 on the bottom of trench 315 and on the bottom of through-hole 325 is entirely removed, third barrier layer 307 is formed directly on the bottom of trench 315, on the bottom of through-hole 325, and on the remaining barrier layer 306 on the sidewalls of trench 315 and on the sidewalls of through-hole 325. Third barrier layer 307 may include TaN, Ta, or a stack of at least one TaN layer and one Ta layer. In one exemplary embodiment, Ta can be deposited as third layer 307 with the bias power of the substrate bias in the range between about 200 W and about 800 W (e.g., 400 W, 500 W, 700 W, etc.) using a sputtering process with a sputtering power applied to the target in the range between about 10 kW and about 25 kW (e.g., 15 kW, 20 kW, etc.). Although the plasma is moved substantially perpendicular to the bottom and the bottom of the through-hole by the vertical bias, the plasma may still cause damage to the portion of the barrier layer on the sidewalls of the trench and on the sidewalls of the through-hole and to the portion of the barrier layer at the bottom of the trench and on the sidewalls adjacent to the through-hole. Thus, after the bombardment of barrier layer 306 with plasma, any damage to barrier layer 306 during the plasma bombardment may be repaired by depositing third barrier layer 307 on the remaining barrier layer 306. Third barrier layer 307 may have a thickness in the range between 10 angstroms and 200 angstroms.

Figure 3F:
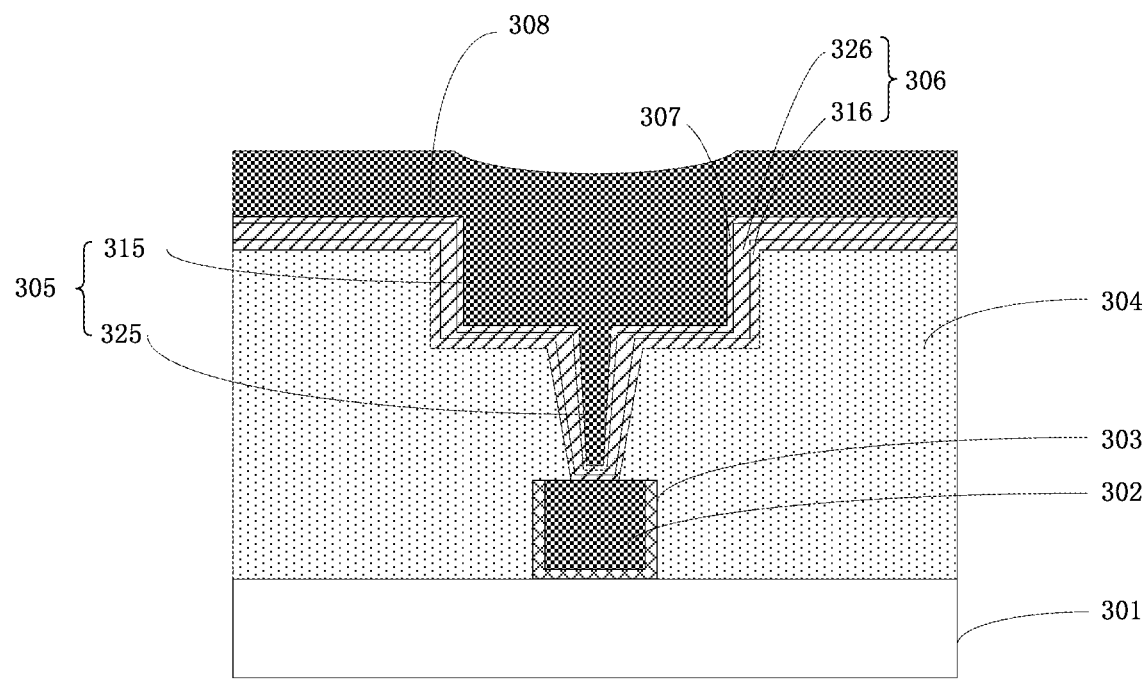
FIG. 3F is a cross-sectional view illustrating an intermediate stage of a method for manufacturing an interconnect structure according to one embodiment of the present disclosure.

Next, referring to FIG. 3F, a second metal layer 308 is formed filling opening 305. Second metal layer 308 may include copper. For example, the opening may be electroplated with copper to form the second metal layer. In a preferred embodiment, a seed layer 309 may be formed on third barrier layer 307 prior to filling the opening with the second metal layer. For example, seed layer 309 (not shown) may be deposited with a bias power of the substrate bias in the range between about 60 W and about 1200 W (e.g., 100 W, 500 W, 700 W, etc.) using a sputtering process with a sputtering power applied to the target in the range between about 20 kW and about 40 kW (e.g., 25 kW, 30 kW, 35 kW, etc.). In one embodiment, seed layer 309 may include Cu, a CuAl alloy film, or a CuMn alloy film. Preferably, the seed layer is a CuMn alloy film. The CuMn (copper-manganese) alloy film can serve as a seed layer for the subsequent deposition of the second metal layer and also to compensate for the decrease in the barrier capability of barrier layer 306 and third barrier layer 307. More preferably, the CuMn alloy film has an atomic percent of Mn in the range between 0.05% and 10% (e.g., 0.5%, 1%, 4%, 8%, etc.) to better compensate for the decrease in the barrier capability of barrier layer 306 and third barrier layer 307. In a non-limiting exemplary embodiment, the seed layer has a thickness from about 200 angstroms to about 2000 angstroms, e.g., 400 angstroms, 600 angstroms, 1000 angstroms, 1500 angstroms, etc.

Next, referring to FIG. 3G, a planarization process is performed on second metal layer 308 so that the upper surface of second metal layer 308 is substantially flush with the upper surface of dielectric layer 304. For example, a chemical mechanical polishing (CMP) process may be performing on second metal layer 308.

It is noted that some above-described steps may be preferred steps, but they are optional (i.e., not necessary) steps. In one example embodiment, referring back to FIG. 3E, the step of forming a third barrier layer 307 on the remaining barrier layer 306 may be a preferred step, but the step is optional and not necessary. In one embodiment, third barrier layer 307 is not formed so that second metal layer 308 can be directly formed filling opening 305.

In one embodiment, the bias (including the first bias, the second bias, the vertical bias) applied to the substrate is an AC bias, and the bias power applied to the target in the sputtering process is a DC bias power. In addition, the sputtering gas used in the sputtering process may be an inert gas, e.g., argon, and the flow rate of the argon gas may be in the range between 2 sccm and 10 sccm, e.g., 5 sccm, 8 sccm, etc.

A method for manufacturing an interconnect structure has been described above according to some embodiments of the present disclosure.

Referring back to FIG. 3G, an interconnect structure may include a substrate 301, a first metal layer 302 on substrate 301, a dielectric layer 304 on substrate 301 covering first metal layer 302, and an opening 305 extending through dielectric layer 304 to a surface of first metal layer 302. Opening 305 includes a trench 315 in the an upper portion and a through-hole 325 in a lower portion. The interconnect structure may also include a first barrier layer 316 on the bottom and sidewalls of trench 315 and on the bottom and sidewalls of through-hole 316, a second barrier layer 326 on first barrier layer 316, and a second metal layer 308 on second barrier layer 326 and filling opening 305. First barrier layer 316 is formed by applying a first bias to the substrate, and the second barrier layer is formed by applying a second bias to the substrate, the second bias is greater than the first bias. The sum of thicknesses of first barrier layer 316 on the bottom of the through-hole and of second barrier layer 326 on the bottom of the through-hole is less than the sum of thicknesses of first barrier layer 316 on a sidewall of the through-hole and of second barrier layer 326 on a sidewall of the through-hole.

In one embodiment, still referring to FIG. 3G, the interconnect structure may further include a third barrier layer 307 disposed between second barrier layer 326 and second metal layer 308.

In one embodiment, still referring to FIG. 3G, the interconnect structure may further include a seed layer (not shown) between third barrier layer 307 and second metal layer 308. The seed layer may include Cu, a CuAl alloy film, or a CuMn alloy film.

FIG. 4 is a simplified flowchart of a method for manufacturing an interconnect structure according to another embodiment of the present disclosure. Referring to FIG. 4, the method may include the following steps;

Step 402: providing a substrate structure. The substrate structure includes a substrate, a first metal (e.g., Cu) layer on the substrate, a dielectric layer on the substrate covering the first meal layer, and an opening extending through the dielectric layer to the first metal layer. The opening including a trench in the an upper portion and a through-hole in a lower portion.

Step 404: forming a barrier layer using a deposition process on the bottom and sidewalls of the trench and on the bottom and sidewalls of the through-hole with no bias power (i.e., 0 W) applied to the substrate. The barrier layer may include TaN, Ta, or a stack of at least one TaN layer and a Ta layer.

Step 406: removing at least one portion of the barrier layer on the bottom of the trench and at least one portion of the barrier layer on the bottom of the through-hole by bombarding the barrier layer with a plasma and with a vertical bias applied to the substrate. In one embodiment, only a portion of the barrier layer on the bottom of the trench and a portion of the barrier layer on the bottom of the through-hole are removed. In another embodiment, the portion of the barrier layer on the bottom of the trench and the portion of the barrier layer on the bottom of the through-hole are completely removed.

Step 408: forming a second metal layer to fill the opening. In one embodiment, the second metal layer includes copper.

In the embodiment, the barrier layer is deposited without applying a bias to the substrate. This allows the barrier layer to be more easily removed due to the relatively low bonding force between the barrier layer and the first metal layer in comparison to the deposition of the barrier layer with a high bias voltage in the prior art, so that the barrier layer can be removed with a relatively smaller vertical bias when bombarding the bottom of the trench and the bottom of the through-hole with plasma, thereby reducing the likelihood of spikes in the dielectric layer and improving the reliability of the interconnect structure.

References in the specification to "one embodiment", "an embodiment", "an example embodiment" "some embodiments", etc., indicate that the embodiment described may include a particular feature, structure, or characteristic, but every embodiment may not necessarily include the particular feature, structure, or characteristic. Moreover, such phrases are not necessarily, referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. An interconnect structure, comprising:
   a substrate;
   a first metal layer on the substrate;
   a dielectric layer on the substrate covering the first metal layer;
   an opening extending through the dielectric layer to the first metal layer, the opening including a trench in an upper portion and a through-hole in a lower portion;
   a first barrier layer including a first stack of at least one TaN layer and at least one Ta layer on sidewalls of the trench and on sidewalls of the through-hole exposing a bottom of the trench and a bottom of the through-hole;
   a second barrier layer including a second stack of at least one TaN layer and at least one Ta layer on the first barrier layer exposing the bottom of the trench and the bottom of the through-hole;
   a third barrier layer including a third stack of at least one TaN layer and at least one Ta layer disposed on the second barrier layer and overlying the exposed bottom of the trench and the exposed bottom of the through-hole; and
   a second metal layer on the third barrier layer filling the opening.

2. The interconnect structure of claim 1, further comprising:
   a seed layer disposed between the third barrier layer and the second metal layer.

3. The interconnect structure of claim 2, wherein the seed layer comprises a Cu material, a CuAl alloy film, or a CuMn alloy film.

4. The interconnect structure of claim 2, wherein the seed layer comprises a CuMn alloy film having an Mn atomic percent in a range between 0.05% and 10%.

5. The interconnect structure of claim 1, wherein the first metal layer and the second metal layer each comprise copper.

6. The interconnect structure of claim 1, wherein the trench has a width in a range between 20 nm and 80 nm and a depth in a range between 20 nm and 300 nm.

7. The interconnect structure of claim 1, wherein the opening is a dual damascene opening.

8. The interconnect structure of claim 1, wherein the through-hole has a width in a range between 20 nm and 80 nm and a depth in a range between 20 nm and 300 nm.

9. The interconnect structure of claim 1, wherein the first barrier layer has a thickness in a range between 3 angstroms and 15 angstroms; the second barrier layer has a thickness in a range between 10 angstroms and 100 angstroms, and the third barrier layer has a thickness in a range between 10 angstroms and 200 angstroms.

10. An interconnect structure, comprising:
    a substrate;
    a first metal layer on the substrate;
    a dielectric layer on the substrate covering the first metal layer;
    an opening extending through the dielectric layer to the first metal layer, the opening including a trench in an upper portion and a through-hole in a lower portion;
    a first barrier layer including a first stack of at least one TaN layer and at least one Ta layer on a bottom and sidewalls of the trench and on a bottom and sidewalls of the through-hole;
    a second barrier layer including a second stack of at least one TaN layer and at least one Ta layer on the first barrier layer; and
    a second metal layer on the second barrier layer filling the opening,
    wherein a sum of thicknesses of a portion of the first barrier layer and a portion of the second barrier layer on the bottom of the trench is less than 50 percent of a sum of thicknesses of a portion of the first barrier layer and a portion of the second barrier layer on a sidewall of the trench.

11. The interconnect structure of claim 10, further comprising a third barrier layer including a third stack of at least one TaN layer and at least one Ta layer disposed between the second barrier layer and the second metal layer.

12. The interconnect structure of claim 11, further comprising a seed layer disposed between the third barrier layer and the second metal layer.

13. The interconnect structure of claim 12, wherein the seed layer comprises a Cu material, a CuAl alloy film, or a CuMn alloy film.

14. The interconnect structure of claim 12, wherein the seed layer comprises a CuMn alloy film having an Mn atomic percent in a range between 0.05% and 10%.

15. The interconnect structure of claim 10, wherein the first metal layer and the second metal layer each comprise copper.

16. The interconnect structure of claim 10, wherein the opening comprises a dual damascene structure.

\* \* \* \* \*